United States Patent [19]
Yamada et al.

[11] Patent Number: 5,717,727
[45] Date of Patent: Feb. 10, 1998

[54] DIGITAL FILTER AND APPARATUS FOR REPRODUCING SOUND USING THE DIGITAL FILTER

[75] Inventors: Yuji Yamada, Tokyo; Kiyofumi Inanaga, Kanagawa, both of Japan

[73] Assignee: Sony Corporation, Tokyo, Japan

[21] Appl. No.: 716,481

[22] Filed: Sep. 19, 1996

[30] Foreign Application Priority Data

Sep. 28, 1995 [JP] Japan .................... 7-250977

[51] Int. Cl.⁶ .................................................. H04B 1/10
[52] U.S. Cl. ............................. 375/350; 364/724.2
[58] Field of Search .............................. 375/232, 233, 375/350; 381/18, 36, 63, 93, 95; 364/724.01, 724.2, 724.17, 724.19

[56] References Cited

U.S. PATENT DOCUMENTS

4,695,969  9/1987  Sollenberger ................. 375/232
5,025,472  6/1991  Shimizu et al. ................ 381/63
5,432,856  7/1995  Shioda ........................... 381/63
5,579,396  11/1996  Iida et al. ...................... 381/18

FOREIGN PATENT DOCUMENTS

0508805  10/1992  European Pat. Off. ....... H03H 17/04
0674467  9/1995  European Pat. Off. ........... H04S 1/00

Primary Examiner—Stephen Chin
Assistant Examiner—Joseph Roundtree
Attorney, Agent, or Firm—Jay H. Maioli

[57] ABSTRACT

A digital filter is composed of an FIR filter with a finite tap length and a feedback section. An apparatus for reproducing sound is arranged to use the digital filter. In the feedback section, an output of one of a plurality of delaying units included in the FIR filter is attenuated through the effect of a coefficient multiplier. The attenuated output is fed back to an adder located between adjacent delaying units arranged before the one delaying unit. The feedback section repeats the feedback operation to generate an infinitely continuing impulse response.

11 Claims, 8 Drawing Sheets

DIGITAL FILTER AND APPARATUS FOR REPRODUCING SOUND USING THE DIGITAL FILTER

FIELD OF THE INVENTION

The present invention relates to a digital filter, and more particulary a digital filter having a finite impulse response type filter for convoluting an impulse response and an apparatus for reproducing sound through the effect of the digital filter.

BACKGROUND OF THE INVENTION

There has been proposed lots of electronic instruments arranged to have a finite impulse response type filter (referred to as an FIR filter), as shown in FIG. 1, included in a signal processing unit. Those electronic instruments serve to measure an impulse response of a system and reproduce the response through the effect of the FIR filter.

In FIG. 1, a signal fed to an input terminal 81 is sent to many delaying units 82 connected in series. The signals delayed by these delaying units 82 are sequentially transferred on a clock signal synchronized with a sampling period. These delaying units 82 provide taps to their I/O terminals. The signals from these taps are sent to coefficient multipliers 83 in which the signals are multiplied by coefficients. The multiplied values are serially added by adders 84 and then picked out at an output terminal 85. Thus, in an FIR filter, by setting a coefficient for an impulse response for each coefficient multiplier 83, it is possible to carry out the operation of convoluting the impulse response.

An apparatus for adding a reverberation using the aforementioned FIR filter, for example, has the function of measuring an impulse response in a room and reproducing the response through the FIR filter. With this function, it is possible to listen to a reproduced sound having the same reverberation characteristics as that of the sound heard in a room where the sound is actually measured. That is, the reproduced sound has the same reverberation characteristics as that of the actual measured sound of the room.

A type of headphone system for localizing sound image outside of a listener's head using the FIR filter measures an impulse response representing a transfer characteristic from speakers to both ears of the listener and reproduces the response through the effect of the FIR filter. Such a headphone system thus makes it possible to bring about the same effect localizing sound image as does the speaker system.

If the FIR filter is used for precisely realizing a convergence time and a frequency response accurately corresponding to the actually measured impulse response, the FIR filter is required to have a long tap length, which makes it costly and large-scaled.

For such a condition, a FIR filter having a relatively short tap length is proposed. This FIR filter may produce a characteristic approximate to the frequency characteristic of the actual sound. However, this type of FIR filter does not offer a listener a sufficiently high quality sound outside of the listener's head. Or, this type of FIR filter does not produce a clear acoustic image, so that the resulting reproduced signal does not have a high-quality acoustic image location.

Further, a delaying unit having a long delaying time may be used only for reproducing a reverberation time characteristic and an initial reflection characteristic. This type of delaying unit includes a filter for extracting only representative pulses of the impulse response. FIG. 2 shows a representative arrangement of such an apparatus for processing a reverberation-added signal.

As shown in FIG. 2, a signal input at an input terminal 91 is input to an input terminal W of a delaying unit 92. This delaying unit 92 operates to output signals $S_{R1}$, $S_{R2}$ and $S_{R3}$ through output terminals $R_1$, $R_2$ and $R_3$ at different delaying times. Those signals $S_{R1}$, $S_{R2}$ and $S_{R3}$ are attenuated by coefficient multipliers 93, 94 and 95. Then, those signals are added in an adder 96. This adder 96 supplies the signal $S_{RO}$ as an output. This signal $S_{RO}$ is reproduced as an impulse response having coarse pulse intervals in the portion corresponding to an initial reflection of the impulse response shown in FIG. 3.

Next, a signal $S_{R4}$, supplied from an output terminal $R_4$ of the delaying unit 92 to a delaying unit 98 through the adder 97, is delayed as a delaying signal by the delaying unit 98. The delaying signal is attenuated by a coefficient multiplier 99. The attenuated signal is added to the signal $S_{R4}$ by the adder 97. The delaying signal is also attenuated by a coefficient multiplier 100 and then is supplied to an adder 109. Further, the signal $S_{R4}$, supplied from the delaying unit 92 to a delaying unit 102 through an adder 101, is delayed as a delaying signal by the delaying unit 102. The delaying signal is attenuated by a coefficient multiplier 103 and then is added to the signal $S_{R4}$ by the adder 101. The delaying signal is also attenuated by a coefficient multiplier and then is supplied to an adder 109. Moreover, a signal $S_{R4}$, supplied from the delaying unit 92 to the delaying unit 106 through the adder 105, is delayed as a delaying signal by this delaying unit 106. Then, the delaying signal is attenuated by a coefficient multiplier 107 and then is added to the signal $S_{R4}$ by the adder 105. The delaying signal is also attenuated by a coefficient multiplier 108 and then is added to an adder 109.

The added output of the adder 109 is supplied to a delaying unit 111 through an adder 110. Then, the delayed signal is attenuated by a coefficient multiplier 114 and then returned to an adder 110. Further, the added output of the adder 109 is supplied to a coefficient multiplier 112 through the adder 110. The signal attenuated by the multiplier 112 is supplied to an adder 113. The added output of the adder 113 is supplied to a delaying unit 116 through an adder 115. The delayed output is attenuated by a coefficient multiplier 119 and then is returned to the adder 115. Further, the added output of the adder 113 is supplied to a coefficient multiplier 117 through the adder 115 so that the output is attenuated by the multiplier 117. The attenuated signal is supplied to an adder 118.

The signal $S_{R4}$, supplied from the output terminal $R_4$ of the delaying unit 92 to the adders 97, 101 and 105, produces an impulse response corresponding to the dispersed sound shown in FIG. 3 until the signal $S_{R4}$, reaches the adder 118. Each delaying unit may have a value of several msec selected as a delaying time. The dispersed sound, particularly at the starting portion of the dispersed sound, is far coarser impulse response compared to the value of 20 and some ·· sec which is a sampling time interval of the signal processing apparatus normally selected for securing an acoustic band. Hence, the reproduced characteristic is made larger than the actual transmission characteristic even on a frequency axis.

SUMMARY OF THE INVENTION

It is an object of the present invention to provide a digital filter adapted to reproduce a long impulse response with high accuracy, and which may be reduced in size and cost by using an FIR filter with a short tap length.

It is another object of the present invention to provide an apparatus for reproducing sound using the above-noted digital filter and thereby greatly improve the perception of localizing a sound image outside of a listener's head or a sense of forward localization of a sound image, while keeping the apparatus reduced in size and cost.

To carry out the objects, according to an aspect of the invention, a digital filter adapted to have an FIR filter with a finite tap length for producing an impulse response from a pre-measured sound source to a measuring point. The FIR filter has delaying units and includes feedback means having coefficient multipliers and adders, the coefficient multipliers attenuating the output of one of the delaying units, with the attenuated output being fed back to the adder provided between adjacent delaying units and located before the one delaying unit. Here, plural feedback means may be provided.

The feedback means allows the FIR filter with a short tap length to reproduce a long impulse response with high fidelity. This makes it possible to greatly reduce scale of the signal processing unit. In a case where the signal processing unit is composed of digital signal processing ICs, the number of ICs is greatly reduced. This results in reducing the mounting area and the power consumption of the ICs the cost and the size of the overall unit. Further, two or more feedback means make it possible to reproduce a longer impulse response with high fidelity.

To carry out the objects, according to another aspect of the invention, an apparatus for reproducing sound includes a digital filter adapted to have an FIR filter with a finite tap length for producing an impulse response from a pre-measured sound source to a measuring point. The FIR filter has delaying units, and the digital filter includes feedback means having coefficient multipliers and adders. The coefficient multipliers for attenuate the output of one of the delaying units, and the attenuated output is fed back to the adder provided between adjacent delaying units and located before the one delaying unit. Plural feedback means may be provided.

Hence, though the apparatus for reproducing sound has a simple composition and is manufactured at low cost, the apparatus greatly improves the perception of localizing a sound image outside of a listener's head, a sense of forward localization of an acoustic image, a quality of the acoustic image, and/or the perception of localizing a sound image as compared with a conventional FIR filter, keeping the sampling frequency constant and having the same number of taps and the same total tap length.

DESCRIPTION OF THE PREFERRED EMBODIMENTS

Figure 1:
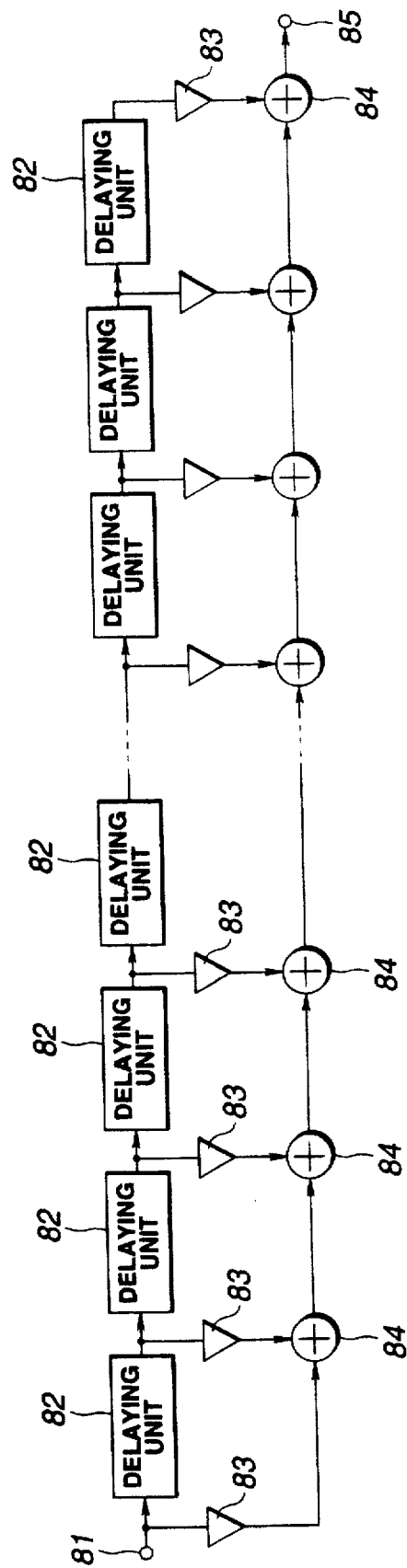
FIG. 1 is a schematic diagram showing an FIR filter.
Figure 2:
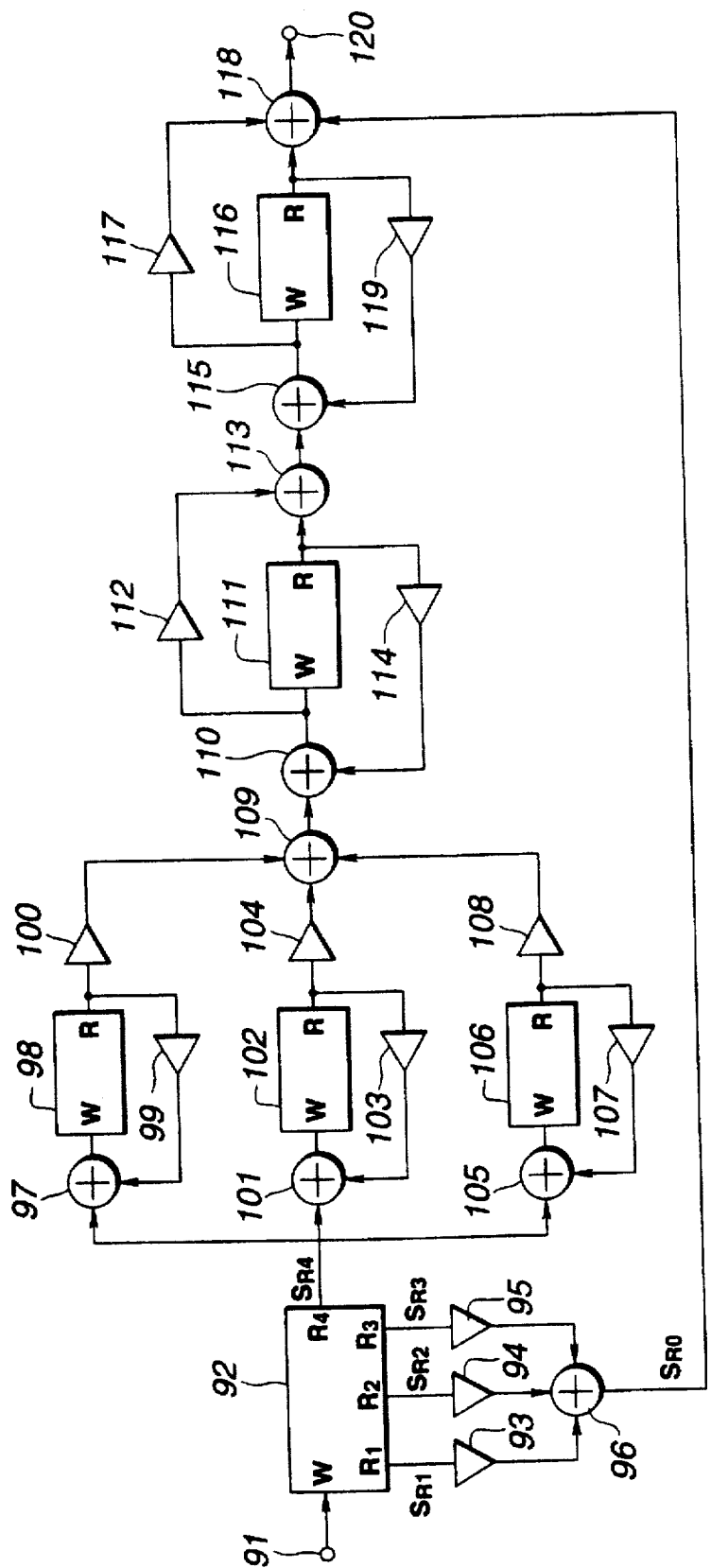
FIG. 2 is a circuit diagram showing a schematic arrangement of the conventional apparatus for processing a reverberant-added signal.
Figure 3:
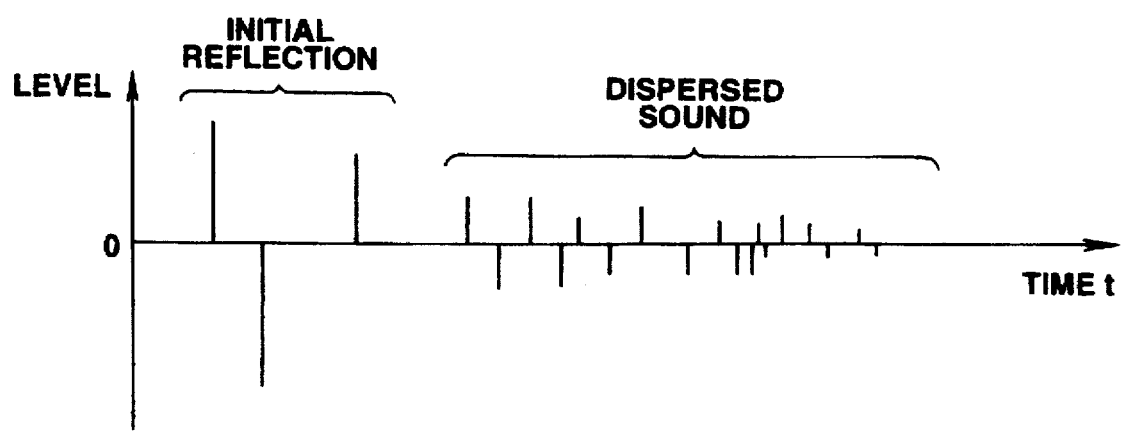
FIG. 3 is a characteristic view showing an impulse response of the conventional apparatus for processing a reverberant-added signal.

Hereinafter, the description will be oriented to a digital filter and an apparatus for reproducing sound according to an embodiment of the present invention.

At first, the digital filter according to an embodiment of the invention will be described with reference to FIGS. 4 to 7. This embodiment is concerned with a digital filter 1 adapted so that an impulse response from a pre-measured sound source to a measuring point is produced through the effect of an FIR filter having a finite tap length. The impulse response is convoluted with a digital speech input signal and the resulting signal is output. The digital filter 1 includes a feedback section 6. In the feedback section 6, an output of a delaying unit $3n$ is attenuated by a coefficient multiplier 4. The attenuated output is fed back to an adder 5 located between a delaying unit $3_2$ and a delaying unit $3_3$ arranged before the delaying unit $3n$ In FIG. 4, a signal input at an input terminal 2 passes through the delaying units $3_1, 3_2, 3_3, \ldots, 3_{n-2}, 3_{n-1},$ and $3_n$, the coefficient multipliers $7_1, 7_2, 7_3, 7_4, \ldots, 7_{m-3}, 7_{m-2}, 7_{m-1}$ and $7_m$, and the adders $8_1, 8_2, 8_3, \ldots, 8_{n-3}, 8_{n-2}, 8_{n-1},$ and $8_n$, in which an impulse response corresponding to a total delaying time of all the delaying units is convoluted with the signal.

Figure 5:
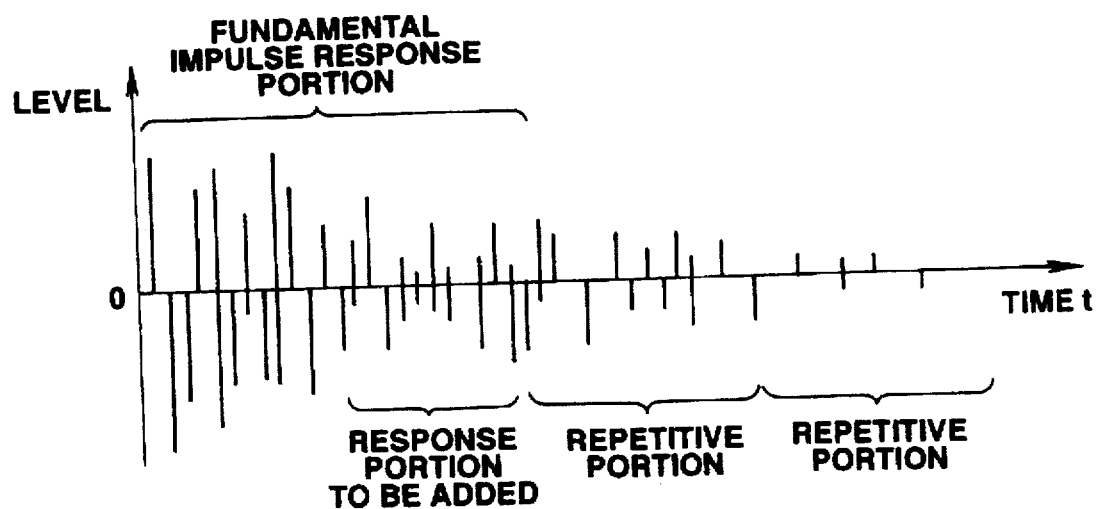
FIG. 5 is a characteristic view showing an impulse response realized by the digital filter shown in FIG. 4.
Figure 6:
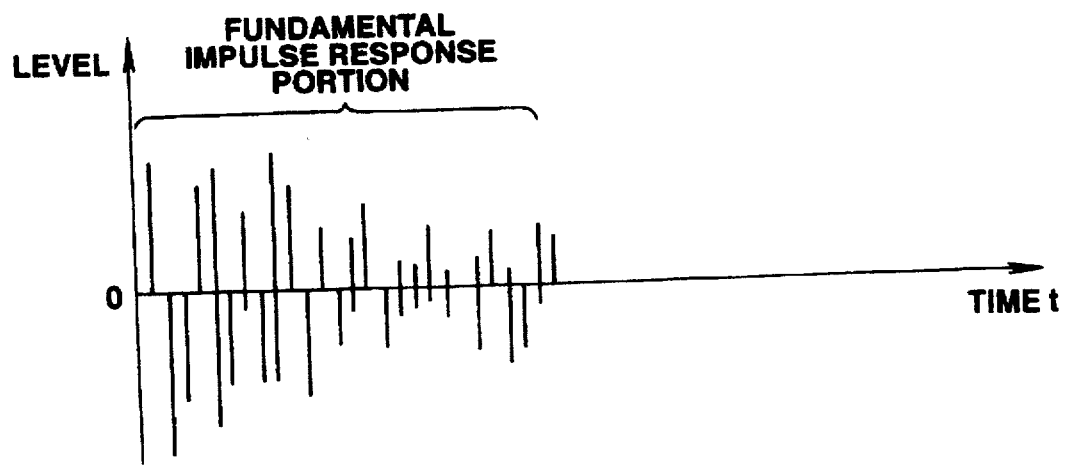
FIG. 6 is a characteristic view showing an impulse response of the conventional digital filter having no feedback section.

On the other hand, in the feedback section 6, a signal picked out of the last delaying unit $3n$ is attenuated by the coefficient multiplier 4 and then is fed back to the adder 5 located between the delaying units $3_2$ and $3_3$. This signal is delayed by a group of delaying units composed of the delaying units $3_3, \ldots, 3_{n-2}, 3_{n-1},$ and $3_n$. Then, the coefficients are convoluted with the signal through the effect of the coefficient multipliers $7_4, \ldots, 7_{m-3}, 7_{m-2}, 7_{m-1},$ and $7_m$. In this digital filter 1, the feedback section 6 repeats the foregoing feedback process for generating infinitely continuous impulse response. Then, a speech signal corresponding to the impulse response characteristic, as shown in FIG. 5, is output at an output terminal 9. In FIG. 5, a repetitive portion is formed by the feedback section 6. FIG. 5 illustrates the first and the second repetitive waveforms. Actually, the waveforms are repeated and infinitely attenuated. On the other hand, for comparison, FIG. 6 shows an impulse response characteristic in the case where no feedback section 6 is provided.

Figure 4:
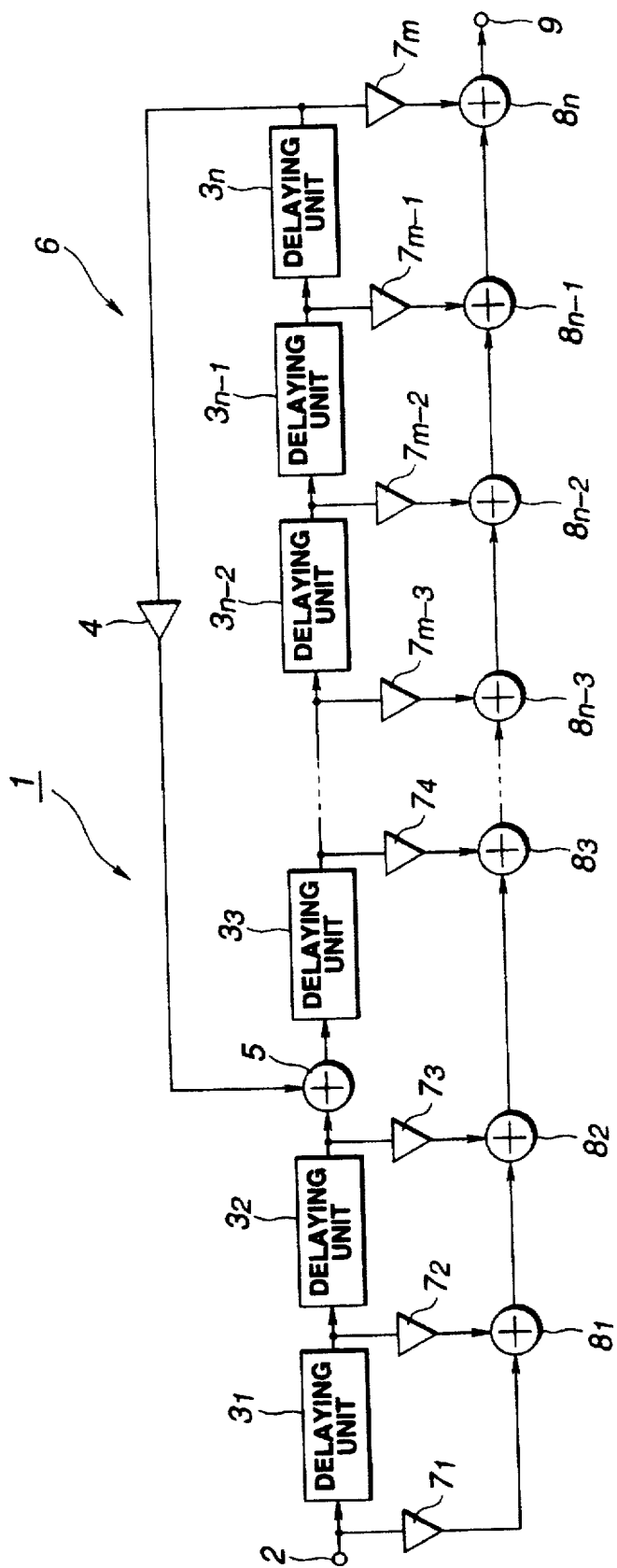
FIG. 4 is a circuit diagram showing a schematic arrangement of a digital filter according to an embodiment of the present invention.

According to the arrangement as shown in FIG. 4, a response portion to be added is the impulse response from which a portion around the leading edge is removed. In the reverberant characteristic of a room, for example, the portion around the leading edge of the impulse response is occupied by an initial reflection. However, the second half of the impulse response is removed because of the restriction caused by the tap length of the FIR filter. This second half of a impulse response is mainly based on the dispersed sound, which has the different characteristic from the portion around the leading edge of the impulse response. Hence, the addition of the impulse response from which the portion around the leading edge of the response is removed indicates the addition of the impulse response portion of the dispersed sound. The resulting response becomes more natural for listening.

Hence, this digital filter 1 makes it possible to represent a long impulse response even with the FIR filter having a short tap length. This can greatly reduce the scale of the signal-processing unit. If the signal processing unit is composed of ICs for digital signals, the necessary number of ICs is greatly reduced. Apparently, this results in reducing a mounting area and power consumption and lowers the cost of the overall system.

Figure 7:
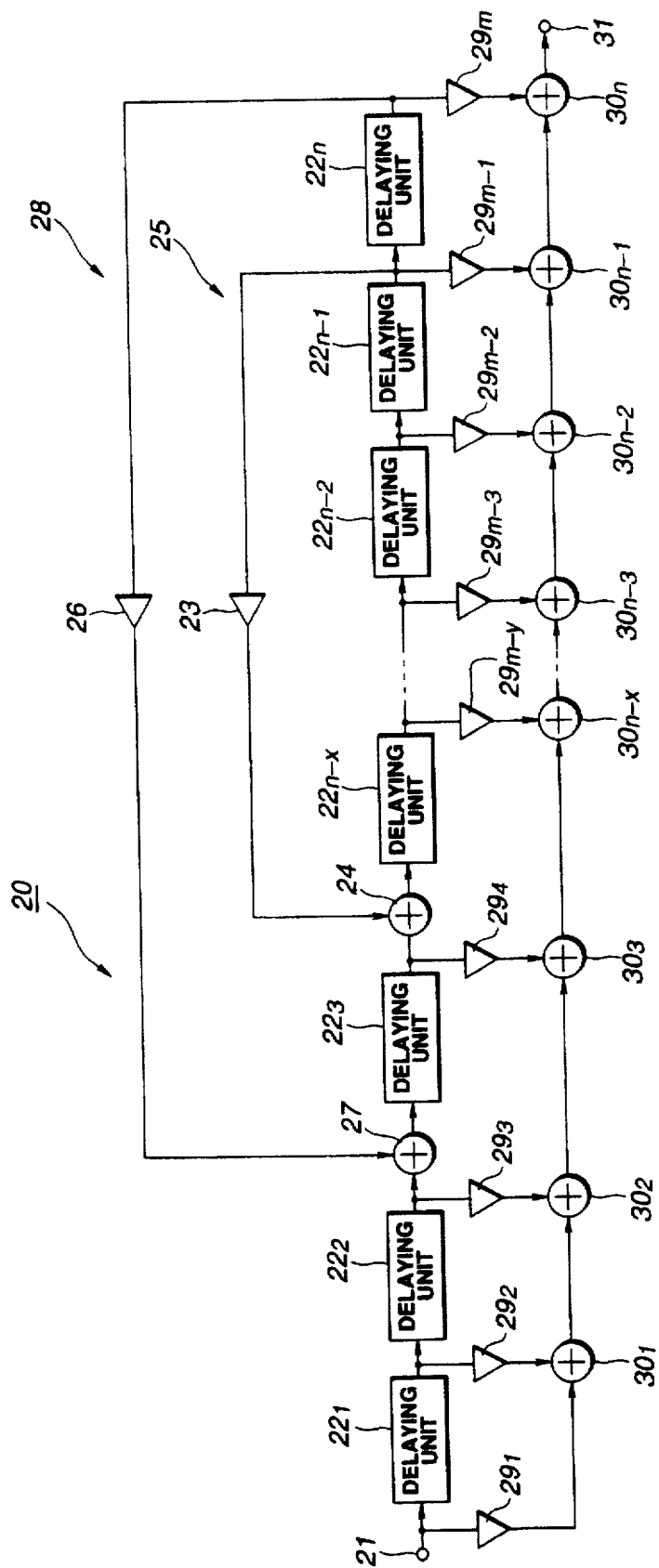
FIG. 7 is a circuit diagram showing a schematic arrangement of a digital filter according to another embodiment of the present invention.

Next, the description will be directed to a digital filter according to another embodiment of the present invention with reference to FIG. 7. This embodiment is concerned with a digital filter 20 adapted so that an impulse response from a pre-measured sound source to a measuring point is produced through the effect of an FIR filter with a finite tap length. The impulse response is convoluted with a digital input signal, and then the resulting signal is output. Unlike the foregoing embodiment, two feedback sections 28 and 28 are provided. In the feedback section 25, an output of a delaying unit $22_{n-1}$ is attenuated by a coefficient multiplier 23. The attenuated output is fed back to an adder 24 located between the adjacent delaying units $22_3$ and $22_{n-x}$ arranged before the delaying unit $22_{n-1}$. In the feedback section 28, an output of a delaying unit $22n$ is attenuated by a coefficient multiplier 26. This attenuated output is fed back to an adder 27 located between delaying units $22_2$ and $22_3$ arranged before the delaying unit $22_n$.

In FIG. 7, a signal input at an input terminal 21 passes through the delaying units $22_1$, $22_2$, $22_3$, . . . , $22_{n-x}$, . . . , $22_{n-2}$, $22_{n-1}$, and $22_n$, the coefficient multipliers $29_1$, $29_2$, $29_3$, $29_4$, . . . , $29_{m-1}$, . . . , $29_{m-2}$, $29_{m-1}$, and $29_m$, and the adders $30_1$, $30_2$, $30_3$, . . . , $30_{n-x}$, . . . , $30_{n-3}$, . . . , $30_{n-2}$, $30_{n-1}$, and $30_n$, which compose the FIR filter. Through the FIR filter, an impulse response corresponding to a total delaying time of all the delaying units is convoluted with the input signal.

On the other hand, in the feedback section 25, a signal picked out of the delaying unit $22_{n-1}$ is attenuated by the coefficient multiplier 23. Then, the signal is applied to the adder 24. In the feedback section 28, a signal picked out of the delaying unit $22_n$ is attenuated by the coefficient multiplier 26. Then, the attenuated signal is applied to the adder 27.

After the passage of the delaying time from when the signal is input to the input terminal 21 to when the signal is picked out of the feedback sections 25 and 28, the coefficient multipliers located after the adders 24 and 27 operate to convolute the coefficients with these signals. The coefficient-convoluted signals are then output. In the impulse response, therefore, the repetitive portion is composed of the overlapped signals of the feedback sections 25 and 28. The content of the repetitive portion is infinitely repeated as the different impulse responses are being alternately attenuated.

According to the arrangement shown in FIG. 7, the response portion to be added is the impulse response from which the portion around the leading edge is removed. Here, in the reverberant characteristic of the room, the portion around the leading edge of the impulse response is occupied by an initial reflection. However, the second half of the impulse response, which is removed because of the restriction caused by the tap length of the FIR filter, is mainly based on the dispersed sound. The second half has a different characteristic from the portion around the leading edge of the impulse response. The addition of the response from which the portion around the leading edge is removed corresponds to the addition of the impulse response of the dispersed sound. The resulting response is a more natural sound.

As described above, the digital filter 20 enables the representation of a long impulse response even with the FIB filter having a short tap length. This filter 20 makes it possible to greatly reduce the scale of the signal processing unit. If the signal processing unit is composed of ICs for digital signals, the necessary number of ICs can be greatly reduced. This results in reducing the mounting area and the power consumption and lowering the cost of the overall system.

Figure 8:
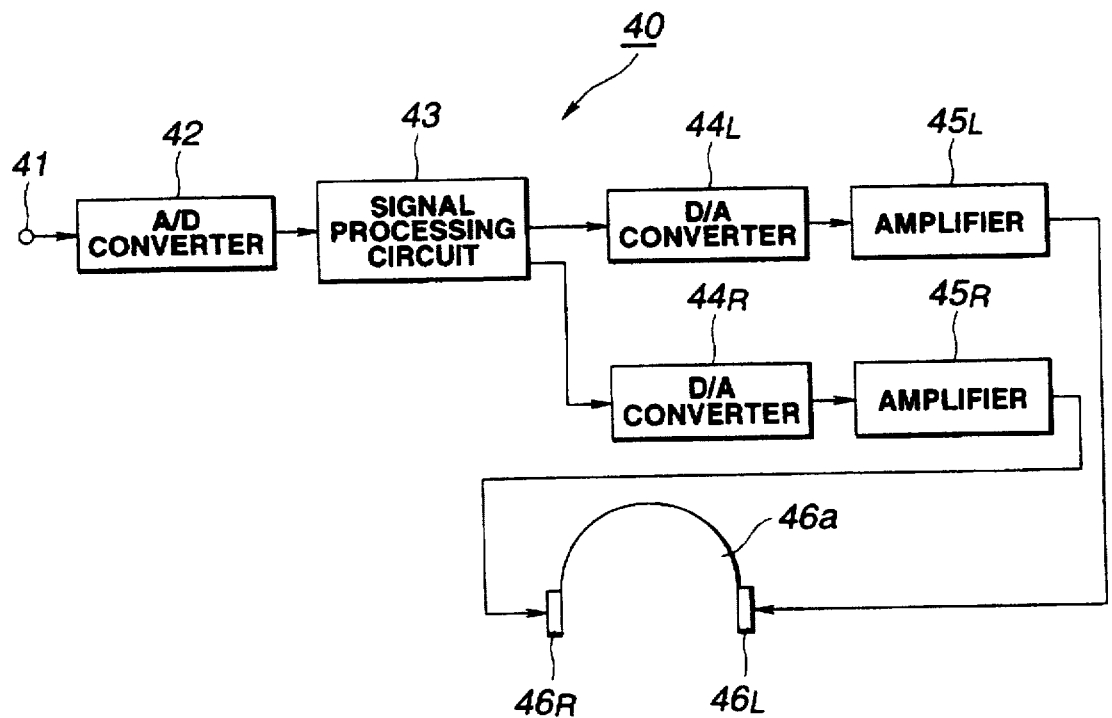
FIG. 8 is a block diagram showing a schematic arrangement of a headphone system for localizing a sound image outside of a listener's head that is an embodiment of an apparatus for reproducing sound according to the present invention.
Figure 9:
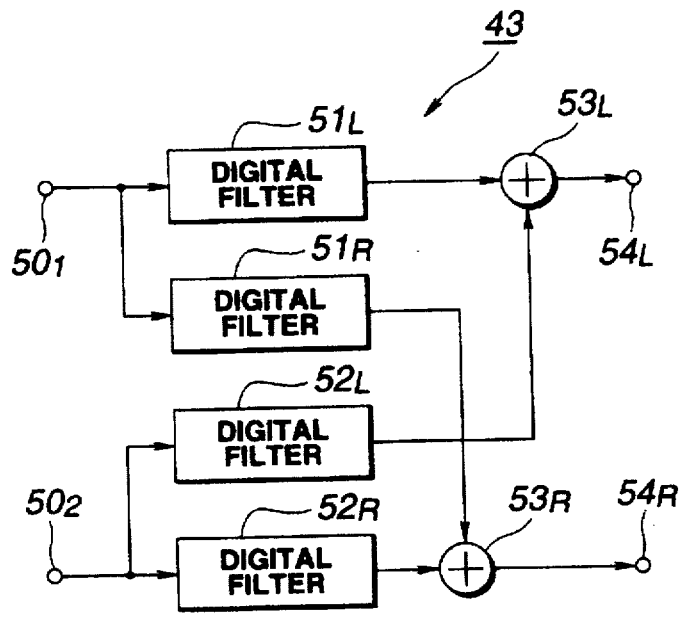
FIG. 9 is a block diagram showing an arrangement of a signal processing circuit used in the headphone system for localizing a sound image outside of a listener's head.

Next, the description will be directed to an apparatus for reproducing sound according to an embodiment of the present invention with reference to FIGS. 8 and 9. This embodiment is concerned with a headphone system 40 for localizing a sound image outside of a listener's head including digital filters $51_L$, $51_R$, $52_L$ and $52_R$ inside of a signal processing circuit 43. These digital filters $51_L$, $51_R$, $52_L$ and $52_R$ are the same as the digital filter 1 described above.

In FIG. 8, an analog speech signal input at a speech input terminal 41 is converted into a digital signal through the effect of an analog-to-digital (A/D) converter 42. The digital signal is applied to the signal processing circuit 43 in which the signal is filtered to localize a sound image outside of the listener's head.

The speech digital signal, filtered by the signal processing circuit 43 for localizing the acoustic image outside of the listener's head, is divided as a stereo signal into two systems L and R. The digital signals are converted into the analog signals through the effect of digital-to-analog (D/A) converters $44_L$ and $44_R$. The analog signals are power amplified by amplifiers $45_L$ and $45_R$ and then are supplied to sounding bodies $46_L$ and $46_R$ mounted to a head band 46a.

For example, the signal processing circuit 43 performs a process of pre-measuring the impulse responses of four systems in total from two sounding sources located in front of a listener to the ears of the listener and convolutes the characteristics of the impulse responses. This processing is implemented by the arrangement shown in FIG. 6.

In FIG. 9, the signals input at first and second input terminals $50_1$ and $50_2$ are supplied to the digital filters 51L, 51R and 52L, 52R respectively. The outputs of the digital filters 51L and 52L are added by an adder $53_L$. The outputs of the digital filters $51_R$ and $52_R$ are added by an adder $53_R$. The added output from the adder $53_L$ is output at an output terminal $54_L$. The added output from the adder $53_R$ is output at an output terminal $54_R$. As described above, each of the digital filters $51_L$, $51_R$ and $52_L$, $52_R$ is composed of the same FIR filter as the foregoing digital filter 1. The digital filter includes a feedback section in which an output of a delaying unit of the FIR filter is attenuated by a coefficient multiplier and the attenuated output is fed back to an adder located between adjacent delaying units arranged before the delaying unit from which the output is picked.

Since the FIR filter may be simplified and reduced in size, the headphone system 40 for localizing the sound image outside of the listener's head is reduced in size and made inexpensive.

In addition, each of the digital filters 51L, 51R and 52L, 52R may take the same arrangement as the digital filter 20 shown in FIG. 7.

As described above, the headphone system 40 is adapted so that the digital filter for convoluting the impulse response from the sound source to both of the ears includes the feedback section for attenuating an output of a delaying unit through the effect of a coefficient multiplier and feeding back the attenuated output to an adder located between adjacent delaying units arranged before the delaying unit from which the output is picked. Hence, it is possible to improve the perception of localizing a sound image outside of a listener's head or the sense of forward localization of a sound image with a simple composition at low cost.

Next, the description will be directed to an apparatus for reproducing sound according to another embodiment of the present invention. This embodiment is concerned with a speaker system that includes two speakers for fixing acoustic images at different locations.

Figure 10:
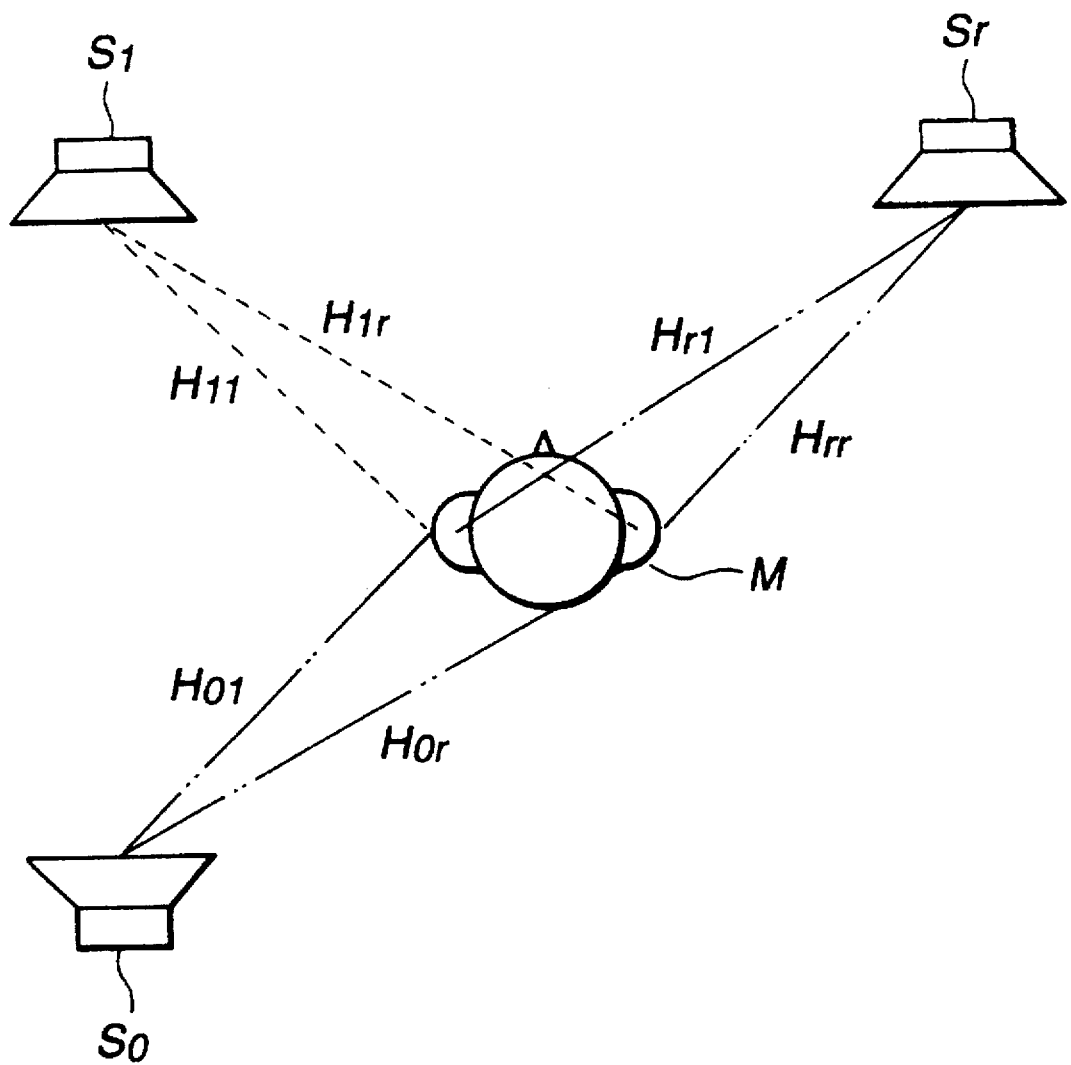
FIG. 10 is a model view for describing a principle of a speaker system that is another embodiment of the apparatus for reproducing sound according to the present invention.

The principle of this speaker system will be described with reference to FIG. 10. In a case where sound sources $S_1$ and $S_r$ are used for reproducing an acoustic image equivalent to that of the sound source $S_0$ for the ears of a listener M, the sound sources $S_1$ and $S_r$ are represented as follows:

$$S_l = \{(H_{ol} \times H_{rr}) - (H_{or} \times H_{rl})\} / \{(H_{ll} \times H_{rr}) - (H_{lr} \times H_{rl})\} \cdot S_o$$

$$S_r = \{(H_{or} \times H_{ll}) - (H_{ol} \times H_{lr})\} / \{(H_{ll} \times H_{rr}) - (H_{lr} \times H_{rl})\} \cdot S_o$$

wherein $H_{ll}$ and $H_{lr}$ are transfer functions from the sound source $S_l$ to ears of the listener M, $H_{rl}$ and $H_{rr}$ are transfer functions from the sound source $S_r$ to both of the ears of the receiver M, and $H_{ol}$ and $H_{or}$ are transfer functions from the sound source $S_o$ to ears of the listener M.

If the impulse response derived by converting the transfer functions into a time domain is convoluted with the signals output from the sound sources $S_l$ and $S_r$, the acoustic image is located at the site of the sound source $S_o$. If this impulse response is produced through the digital filter, the digital filter has to be an FIR filter having a long tap length. The speaker system according to this embodiment includes the same digital filter as the foregoing digital filters 1 and 20. Hence, it is possible to locate a sound image remote from the two speakers with a simple constitution at low cost.

If the digital filter is applied to a sound field simulating system, a long response time can be reproduced with a small number of taps. Hence, the reverberation is conventionally generated by taking the steps of capturing characteristic pulses in a perspective view of the impulse response, and taking more coarse time intervals than the sampling times. In this embodiment, on the other hand, the reverberation is generated by taking more dense pulses distributed at each sampling time. This makes it possible to reproduce a sound field with high fidelity.

What is claimed is:

1. A digital filter comprising:

an input terminal for inputting a digital signal;

a finite impulse response filter for convoluting an impulse response in said digital signal, said finite impulse response filter comprising a plurality of delaying units, a plurality of first adders, and a plurality of first coefficient multipliers, said impulse response being obtained by measuring from a source to a measuring point; and feedback means for attenuating an output supplied from a selected one of said plurality of delaying units through a second coefficient multiplier and producing an attenuated output and feeding back said attenuated output to a second adder connected between a selected pair of adjacent delaying units arranged before said selected one of said plurality of delaying units from which said output is supplied.

2. A digital filter comprising:

an input terminal for inputting a digital audio signal;

a finite impulse response filter for convoluting an impulse response in said digital audio signal, said finite impulse response filter including a plurality of delaying units, a plurality of first adders, and a plurality of first coefficient multipliers, said impulse response being obtained by measuring from an audio source to a measuring point; and feedback means for attenuating an output supplied from a selected one of said plurality of delaying units through a second coefficient multiplier and producing an attenuated output and feeding back said attenuated output to a second adder connected between selected adjacent ones of said plurality of delaying units and arranged before said selected one of said plurality of delaying units from which said output is supplied.

3. The digital filter according to claim 1, further comprising a plurality of feedback means connected to a plurality of second adders respectively connected between selected pairs of adjacent delaying units.

4. The digital filter according to claim 2, further comprising a plurality of feedback means respectively connected to a plurality of second adders respectively connected between selected pairs of adjacent delaying units.

5. The digital filter according to claim 1, wherein a number of said plurality of delaying units is equal to a number of said plurality of first adders.

6. The digital filter according to claim 2, wherein a number of said plurality of delaying units is equal to a number of said plurality of first adders.

7. The digital filter according to claim 1, wherein a coefficient corresponding to said impulse response is provided to each of said plurality of first coefficient multipliers.

8. The digital filter according to claim 2, wherein a coefficient corresponding to said impulse response is provided to each of said plurality of first coefficient multipliers.

9. An apparatus for reproducing sound, said apparatus comprising:

a digital filter for filtering a digital audio signal; and a loudspeaker for outputting sound corresponding to said digital audio signal output by said digital filter, wherein said digital filter includes:

an input terminal for inputting said digital audio signal;

a finite impulse response filter for convoluting an impulse response in said digital audio signal, said finite impulse response filter having a plurality of delaying units, a plurality of first adders, and a plurality of first coefficient multipliers, said impulse response being obtained by measuring from a sound source to a measuring point; and feedback means for attenuating an output supplied from a selected one of said plurality of delaying units through a second coefficient multiplier and producing an attenuated output and feeding back said attenuated output to a second adder connected between a selected pair of adjacent delaying units and arranged before said selected one of said plurality of delaying units from which said output is supplied.

10. An apparatus for reproducing sound, said apparatus comprising:

signal processing means for locating a sound image at a predetermined position, said signal processing means having a digital filter; and a loudspeaker for outputting sound corresponding to an output of said signal processing means, wherein said digital filter includes:

an input terminal for inputting a digital audio signal;

a finite impulse response filter for convoluting an impulse response with said digital audio signal, said finite impulse response filter having a plurality of delaying units, a plurality of first adders, and a plurality of first coefficient multipliers, said impulse response being obtained by measuring from a sound source to a measuring point; and feedback means for attenuating an output supplied from a selected one of said plurality of delaying units through a second coefficient multiplier and producing an attenuated output and feeding back said attenuated output to a second adder connected between a selected pair of adjacent delaying units arranged before said selected one of said plurality of delaying units from which said output is supplied.

11. A sound reproducing apparatus comprising:

a head attaching means for attachment to a user's head;

a loudspeaker for outputting sound, said loudspeaker provided on said head attaching means; and signal processing means for locating a sound image outside of said user's head, said signal processing means having a digital filter and producing an output fed to said loudspeaker, wherein said digital filter includes:

an input terminal for inputting a digital audio signal;

a finite impulse response filter for convoluting an impulse response with said digital audio signal, said finite impulse response filter having a plurality of delaying units, a plurality of first adders, and a plurality of first coefficient multipliers, said impulse response being obtained by measuring from a sound source to a measuring point; and feedback means for attenuating an output supplied from a selected one of said plurality of delaying units through a second coefficient multiplier and producing an attenuated output and feeding back said attenuated output to a second adder connected between a selected pair of adjacent delaying units arranged before said selected one of said plurality of delaying units from which said output is supplied.

* * * * *